United States Patent
Mohindra

(10) Patent No.: US 11,664,909 B1
(45) Date of Patent: May 30, 2023

(54) SYSTEM AND METHOD FOR MEASURING PHASE NOISE

(71) Applicant: Keysight Technologies, Inc., Santa Rosa, CA (US)

(72) Inventor: Rishi Mohindra, Milpitas, CA (US)

(73) Assignee: KEYSIGHT TECHNOLOGIES, INC., Santa Rosa, CA (US)

(*) Notice: Subject to any disclaimer, the term of this patent is extended or adjusted under 35 U.S.C. 154(b) by 0 days.

(21) Appl. No.: 17/854,729

(22) Filed: Jun. 30, 2022

Related U.S. Application Data

(62) Division of application No. 17/384,748, filed on Jul. 24, 2021, now Pat. No. 11,424,841.

(51) Int. Cl.
*H04B 17/21* (2015.01)
*H04L 7/033* (2006.01)

(52) U.S. Cl.
CPC .......... *H04B 17/21* (2015.01); *H04L 7/0331* (2013.01)

(58) Field of Classification Search
CPC .... G01R 31/31709; H03L 7/07; H04L 7/0331
See application file for complete search history.

(56) References Cited

U.S. PATENT DOCUMENTS

| | | | |
|---|---|---|---|
| 7,809,517 B1 * | 10/2010 | Zuckerman | H03L 7/07 702/187 |
| 7,952,408 B2 | 5/2011 | Eisenstadt et al. | |
| 10,432,325 B1 | 10/2019 | Slamani et al. | |
| 11,424,841 B1 * | 8/2022 | Mohindra | H04L 7/0331 |
| 2004/0091033 A1 | 5/2004 | Chen | |
| 2008/0247451 A1 * | 10/2008 | Yamaguchi | H03M 1/0836 375/226 |
| 2009/0186587 A1 | 7/2009 | Sobchak et al. | |
| 2010/0327940 A1 | 12/2010 | Eisenstadt et al. | |

(Continued)

FOREIGN PATENT DOCUMENTS

CN 105306053 B 6/2018

OTHER PUBLICATIONS

Craig W. Nelson et al., "A collapse of the cross-spectral function in phase noise metrology", Review of Scientific Instruments 85, Feb. 2014, pp. 1-9.

(Continued)

*Primary Examiner* — Khanh C Tran

(57) ABSTRACT

A system and method are provided for measuring residual phase noise of a measurement signal using a phase detector including a mixer. The method includes injecting a phase noise spur in a stimulus signal having a known magnitude at a known offset frequency from the stimulus signal carrier frequency; inputting the stimulus signal to a DUT to output a measurement signal; inputting the measurement signal to RF input of the mixer via RF path; inputting the stimulus signal to LO input of the mixer via LO path; mixing the measurement and stimulus signals to provide a residual phase noise signal; measuring actual rejection of stimulus phase noise at the know offset frequency; determining a relative delay between the measurement and stimulus signals in the RF and LO paths based on the actual rejection; and minimizing relative delay between the measurement and stimulus signals to reduce residual phase noise measurement floor.

20 Claims, 10 Drawing Sheets

(56) References Cited

U.S. PATENT DOCUMENTS

2012/0256639 A1* 10/2012 Pausini ............ G01R 31/31709
324/613
2015/0016616 A1 1/2015 Roth et al.
2017/0264469 A1 9/2017 Otani

OTHER PUBLICATIONS

Enrico Rubiola et al., "The Effect of AM Noise on Correlation Phase Noise Measurements", 2007 IEEE International Frequency Control Symposium Joint with the 21st European Frequency and Time Forum, Oct. 1, 2007, pp. 1099-1105.
English translation of CN105306053B, 2 pgs.
Waleed Khalil et al., "A Self-Calibrated On-Chip Phase-Noise Measurement Circuit With 75 dBc Single-Tone Sensitivity at 100 kHz Offset", IEEE Journal of Solid-State Circuits, vol. 42, No. 12, Dec. 2007, pp. 2758-2765.
Gilles Cibiel et al., "AM Noise Impact on Low Level Phase Noise Measurements", IEEE Transactions on Ultrasonics, Ferroelectrics, and Frequency Control, vol. 49, No. 6, Jun. 2002, pp. 784-788.
Hu Song et al., "Analysis and design of a high-linearity receiver RF front-end with an improved 25%-duty-cycle LO generator for WCDMA/GSM applications", Journal of Semiconductors, vol. 33, No. 2, Feb. 2012, pp. 1-10.
Krzysztof Dufrene et al., "A Novel IP2 Calibration Method for Low-Voltage Downconversion Mixers", IEEE Radio Frequency Integrated Circuits (RFIC) Symposium, 2006, pp. 1-4.
Imtinan Elahi et al., "IIP2 Calibration by Injecting DC Offset at the Mixer in a Wireless Receiver", IEEE Transactions on Circuits and Systems—II: Express Briefs, vol. 54, No. 12, Dec. 2007, pp. 1135-1139.
"Keysight N5511A Phase Noise Test System", Keysight Technologies, Inc., Feb. 1, 2021, https://www.keysight.com/us/en/assets/9018-13550/user-manuals/9018-13550.pdf, 1-369 pgs.

* cited by examiner

SYSTEM AND METHOD FOR MEASURING PHASE NOISE

CROSS-REFERENCE TO RELATED APPLICATION

The present application is a divisional of and claims priority under 35 U.S.C. § 120 from U.S. patent application Ser. No. 17/384,748 to Rishi Mohindra et al., filed on Jul. 24, 2021. The entire disclosure of U.S. patent application Ser. No. 17/384,748 is hereby specifically incorporated by reference in its entirety.

BACKGROUND

Phase detectors are generally used to measure phase noise in test signal from a device under test (DUT), where the test signal is either generated by the DUT for the case of "absolute phase noise" of the DUT, or the test signal is output in response to a stimulus signal from a stimulus source for the case of "residual phase noise" of the DUT. For accurate measurements of either the absolute or residual phase noise, the phase detector should reject or otherwise suppress extraneous noise introduced by the DUT and/or by the stimulus source. Such extraneous noise may include amplitude modulation (AM) noise from the DUT and phase modulation (PM) noise and/or AM noise from the stimulus source. This extraneous noise is particularly problematic whenever it exceeds the noise floor of the phase detector and the measurement system.

However, conventional phase noise test systems have poor AM noise suppression when performing absolute or residual phase noise measurements of a DUT using a phase detector. Generally, the AM noise of the DUT and/or a reference source used to provide quadrature mixing mask out actual measured phase noise. Likewise, conventional phase noise test systems have poor AM noise suppression of the stimulus source and the DUT and poor PM noise suppression of the stimulus source when performing residual phase noise measurements using a phase detector.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
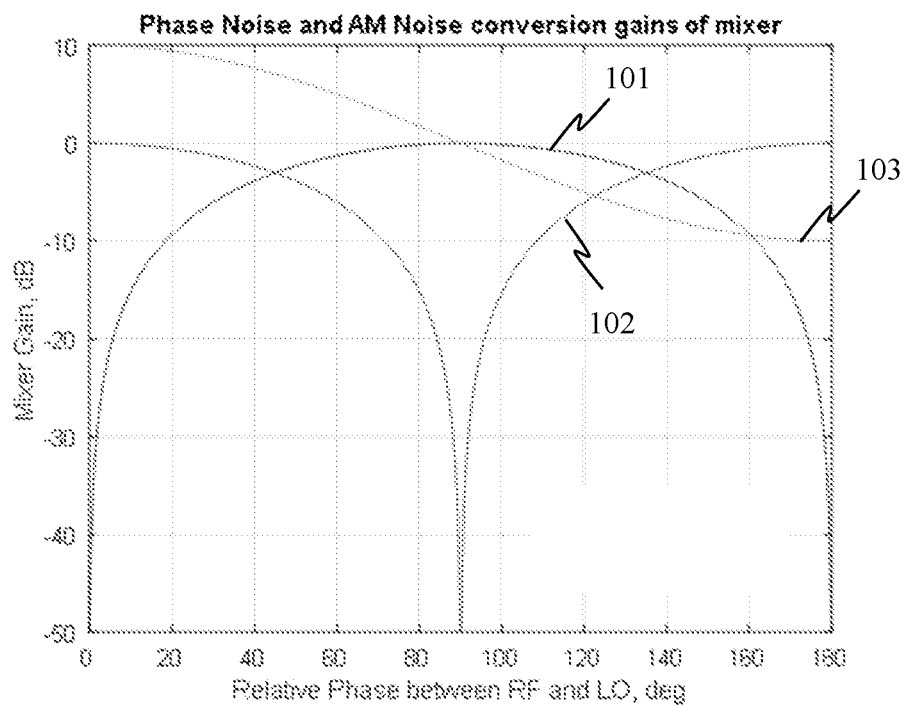
FIG. 1A is a graph showing amplitude modulation (AM) and phase modulation (PM) conversion gain of a phase detector as a function of relative phase between the radio frequency (RF) and local oscillator (LO) inputs of phase detector mixer.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Absolute Phase Noise Measurements

Various embodiments improve AM noise rejection of AM noise from a DUT and a reference source in a phase detector when measuring absolute phase noise of the DUT using the phase detector, such an N5511A phase noise test system or an E5052B signal source analyzer, available from Keysight Technologies, Inc., for example. Conventional phase noise test systems have poor AM noise suppression. That is, the AM noise of the DUT and/or the reference source mask out actual measured phase noise (PM noise) of the input test signals, rendering the results of the phase noise measurements inaccurate.

Due to second order nonlinearities and self-detection, conventional analog phase detectors may have significant DC error at the output. Generally, such phase detectors include a reference source, a mixer for mixing an RF input signal, e.g., from a DUT, input at a radio frequency (RF) port and a reference signal from the reference source input at a local oscillator (LO) port, and a phase locked loop (PLL) for adjusting phase of the reference signal at the reference source through feedback. Ideally, when there is no DC error, the PLL adjusts the reference signal for quadrature (90 degrees relative to the RF input signal) at the mixer inputs for perfect rejection of AM noise and regular detection of phase noise at the mixer output.

According to representative embodiments, a system and method are provided for measuring absolute phase noise of a test signal from a DUT using a phase noise measurement system that includes a reference source for generating an RF reference signal, a mixer for mixing the RF reference signal and an input signal, an adjustable DC voltage source for outputting a DC voltage, and a PLL for maintaining a 90 degree quadrature between the RF reference signal and the input signal. The method includes initially setting the adjustable DC voltage source to output zero DC; mixing a first RF input signal and a first RF reference signal from the reference source at the mixer to provide a first calibration phase signal indicating a phase difference between the first RF input signal and the first RF reference signal; adjusting frequency and phase of the first RF reference signal using the PLL to be substantially the same as frequency and phase of the first RF input signal, and locking the adjusted frequency and phase; mixing a second RF input signal and a second RF reference signal from the reference source having the locked reference frequency and phase at the mixer to provide a second calibration phase signal indicating a phase difference between the second RF input signal and the second RF reference signal, where one of the second RF input signal and the second RF reference signal includes one-tone AM modulation; monitoring the second calibration phase signal output by the mixer at a modulation tone frequency of a tone for the one-tone AM modulation; adjusting the DC voltage output by the adjustable DC voltage source to minimize a tone level of the tone at the modulation tone frequency being monitored, the minimized tone level indicating optimum AM noise rejection; mixing a test signal from the DUT and a test RF reference signal from the reference source having the locked reference frequency and phase at the mixer to provide a measurement phase signal; and measuring absolute phase noise of the test signal based on the measurement phase signal.

According to other representative embodiments, a system and method are provided for measuring absolute phase noise of a test signal from a DUT using a phase detector including a reference source for generating RF reference signals, a mixer for mixing the RF reference signals and the test signal, an adjustable DC voltage source for outputting a DC voltage, and a PLL for maintaining a 90 degree quadrature between the RF reference signals and the test signal. The method includes mixing a test signal from the DUT and an RF reference signal from the reference source at the mixer to provide an output signal indicating a phase difference between the test signal and the first RF reference signal, where a reference frequency of the RF reference signal is close to a test frequency of the test signal; monitoring the output signal with the PLL disabled; adjusting the DC voltage output by the adjustable DC voltage source to cancel out DC noise present in the output signal by forcing total DC to zero based on the monitoring; adding the adjusted DC voltage to the output signal; and measuring absolute phase noise of the test signal by monitoring the output signal with the PLL enabled and the adjusted DC voltage added to the output signal.

FIG. 1A is a graph showing AM conversion gain and PM conversion gain of a phase detector as a function of relative phase between the RF and LO inputs of the mixer. Referring to FIG. 1A, trace 101 shows PM conversion gain in dB, trace 102 shows AM conversion gain in dB, and trace 103 shows DC voltage at the output of the mixer. As can be seen by traces 101 and 102, respectively, the phase noise detection gain is zero dB and the AM noise detection gain is −50 dB or less when the relative phase between the RF and the LO inputs is 90 degrees. The PLL is therefore employed to attempt to maintain the relative phase at 90 degrees, particularly since it is desirable to completely suppress the AM noise. Trace 103 shows that when there is no DC error (DC offset), it enables the PLL to maintain the relative phase between the RF and LO inputs at 90 degrees.

Figure 1B:
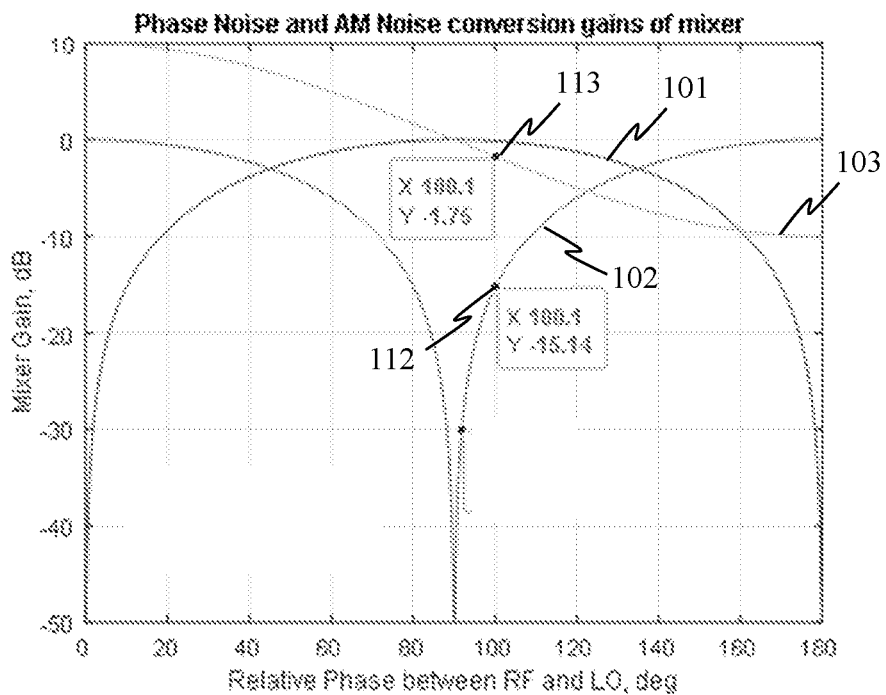
FIG. 1B is a graph showing AM conversion gain and PM conversion gain of the phase detector as a function of relative phase between the RF and LO inputs of the mixer in the presence of DC error.

FIG. 1B is a graph showing AM conversion gain and PM conversion gain of the phase detector as a function of relative phase between the RF and LO inputs of the mixer in the presence of DC error. Referring to FIG. 1B, trace 103 shows introduction of DC error ($V_{error}$) of −1.75V out of a peak detector range of ±10V, indicated by point 113 on trace 103. As a result, the PLL is no longer able to maintain a 90 degree quadrature between the RF and LO inputs of the mixer. The PLL must introduce a phase error (ph), such that sin(ph)=−$V_{error}$/A, where A is the maximum DC output. In the example shown in FIG. 1B, when the DC error is 17 percent of the full scale, there is a 10 degree quadrature phase error (i.e., the relative phase between the RF and LO inputs is 100 degrees as opposed to 90 degrees) and the AM rejection is only 15 dB, indicated by point 112 on trace 102. This results in poor AM rejection of the phase detector.

Figure 2:
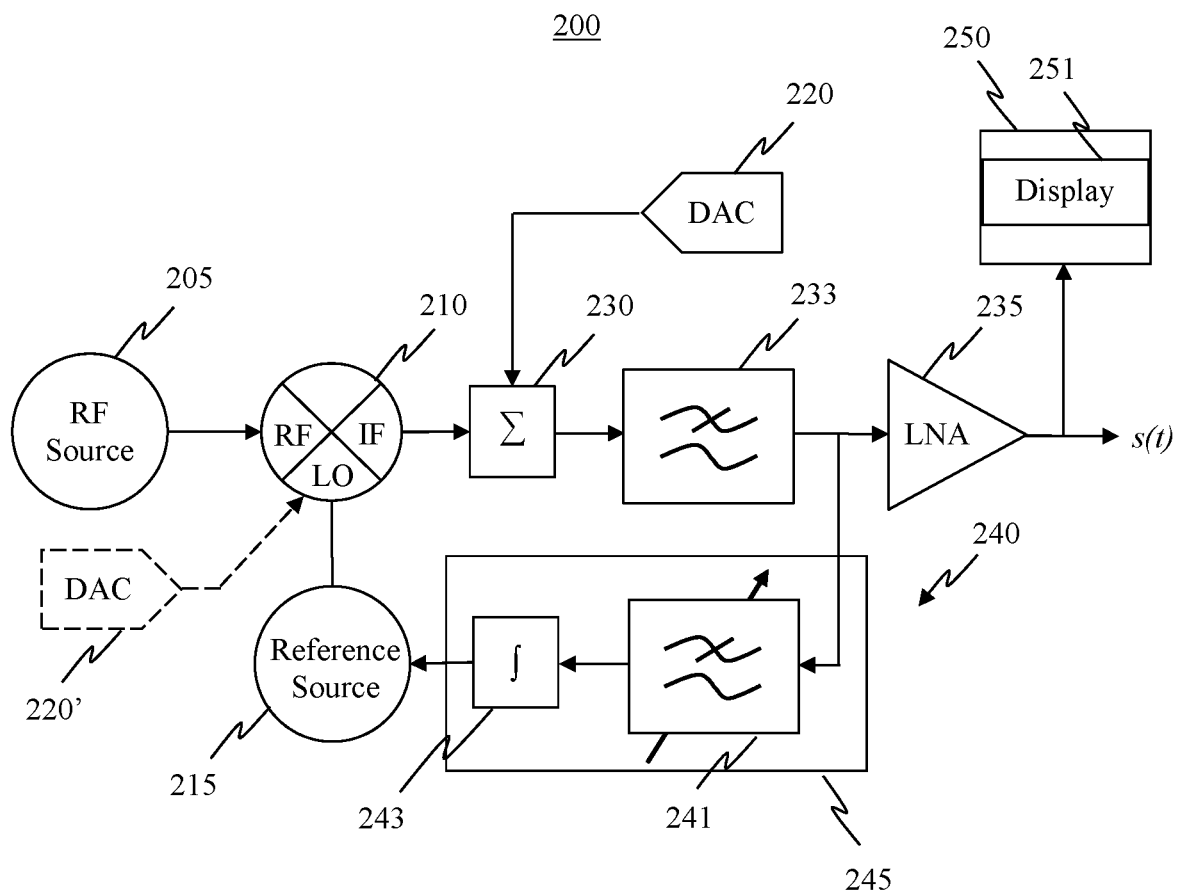
FIG. 2 is a simplified block diagram showing an absolute phase noise measurement system with improved AM rejection, according to a representative embodiment.

The various embodiments described below improve the phase detector's rejection of the AM noise of the DUT and/or the reference source, so that the total AM noise is significantly below the phase noise of the test signal. FIG. 2 is a simplified block diagram showing a phase noise measurement system with improved AM rejection, according to a representative embodiment.

Referring FIG. 2, a single-channel absolute phase noise measurement system 200 includes a mixer 210 and a reference source 215, where mixer 210 is a mixer-based phase detector and the reference source 215 may be a voltage controlled oscillator (VCO), for example. The mixer 210 is configured to receive an input signal output by RF source 205 at an RF port and an RF reference signal output by the reference source 215 at a local oscillator (LO) port, to mix the input signal and the RF reference signal, and to output a phase signal at an intermediate (IF) port. Ideally, the RF reference signal is 90 degrees out of phase with the RF signal. Depending on the implementation, the RF source 205 may be a DUT or a calibration source, for example, as discussed below.

The phase noise measurement system 200 further includes a low-noise digital to analog converter (DAC) 220 and an adder 230 at the output of the mixer 210. The DAC 220 is configured to output a variable DC voltage, which is added to the phase signal by the adder 230. Adjusting the DC voltage output by the DAC 220 adjusts a voltage level of the phase signal. The phase noise measurement system 200 also includes a low pass filter 233 for filtering the DC adjusted phase signal from the adder 230, a low noise amplifier (LNA) 235 for amplifying the filtered phase signal, which is provided as output signal or waveform s(t) from the phase noise measurement system 200. The output signal s(t) may be displayed on display 251 of test instrument 250. The display 250 may be a computer monitor, a liquid crystal display (LCD), an organic light emitting diode (OLED), a flat panel display, or a solid-state display, for example. In an embodiment, the test instrument 250 may be a spectrum analyzer or an oscilloscope, for example, and the display 251 may be the display of the spectrum analyzer or the oscilloscope. The test instrument 250 is configured to monitor the output signal s(t) and/or DC error at the output of the mixer 210. Of course, other types of test instruments capable of spectrum and/or DC error monitoring and display may be incorporated without departing from the scope of the present teachings.

A phase lock loop (PLL) 240 of the phase noise measurement system 200 includes a PLL filter 245, which receives the filtered phase signal from the low pass filter 233, and provides a phase locked tune voltage signal to the reference source 215 as feedback in order to maintain a 90 degree quadrature between the RF reference signal and the input signal. The PLL filter 245 may include a low pass loop filter 241 and an integrator 243.

Figure 3:
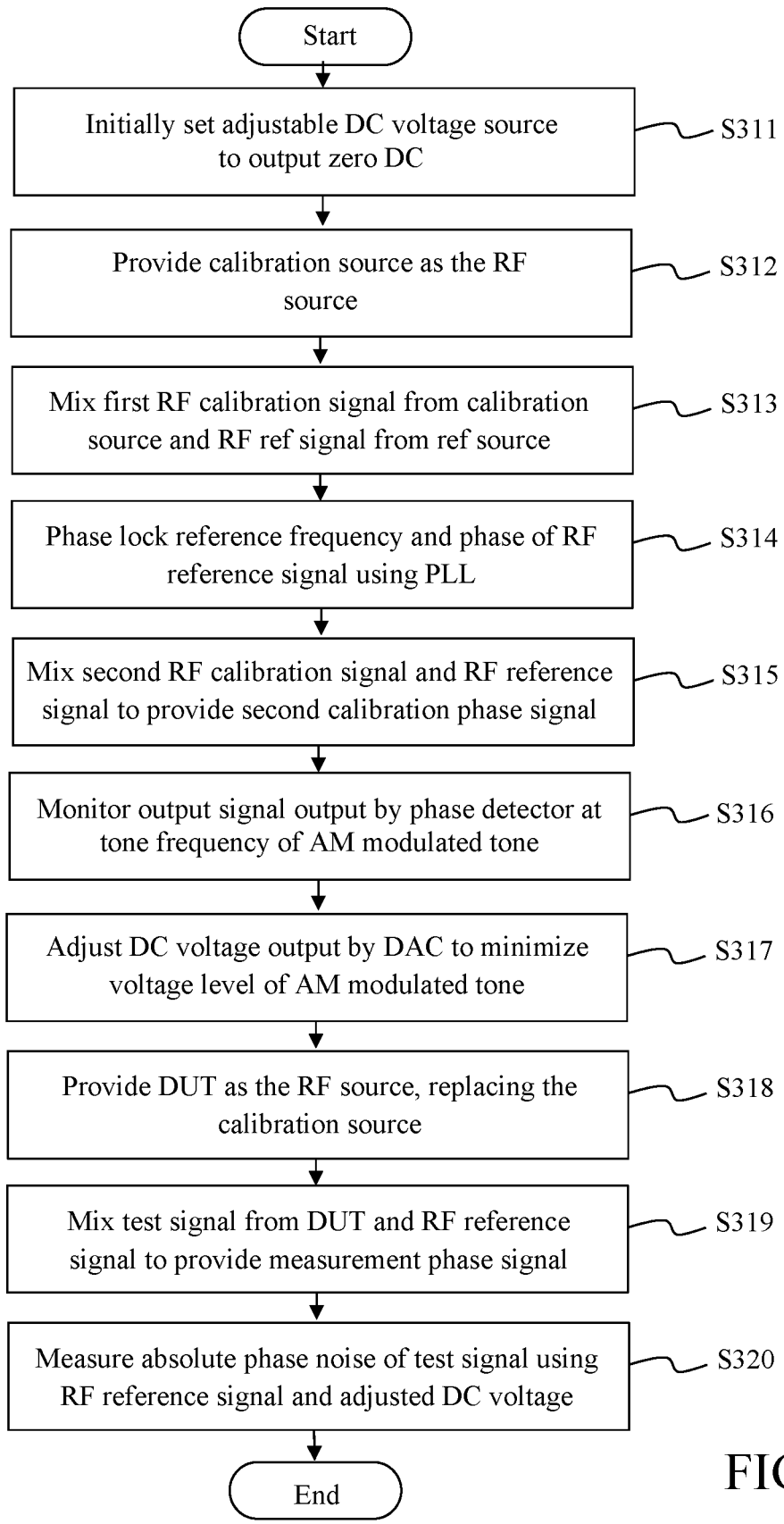
FIG. 3 is a flow diagram of a method of measuring absolute phase noise of a test signal from a DUT using a calibration source providing one-tone AM modulation and an adjustable DC voltage source for improved AM noise rejection, according to a representative embodiment.

FIG. 3 is a flow diagram of a method of measuring absolute phase noise of a test signal from a DUT using a calibration source providing one-tone AM modulation and an adjustable DC voltage source for improved AM noise rejection, according to a representative embodiment.

Referring to FIGS. 2 and 3, an adjustable DC voltage source, such as the DAC 220, is initially set to output zero DC in block S311. The DC voltage output by the DAC 220 may be adjusted manually by the user, or may be automated in measurement firmware or software.

In block S312, a calibration source is provided as the RF source 205. The calibration source is able to perform one-tone AM modulation, as discussed below, and may be implemented as an arbitrary waveform generator (AWG) or a direct digital synthesizer (DDS), for example. The calibration source has the same power level as the DUT that is to be tested following calibration.

In block S313, a first RF calibration signal received from the calibration source at the RF port and a frequency adjustable RF reference signal received from the reference source 215 at the LO port are mixed at the mixer 210 to provide a first calibration phase signal. The first calibration phase signal may be summed with the DC signal output by the DAC 220 by the adder 230, and output by the phase noise measurement system 200 as output signal s(t) after low pass filtering and amplification. As a practical matter, the summing has no effect on the first calibration phase signal since the DC signal has initially been set to zero DC. The first calibration phase signal indicates a phase difference between the first RF calibration signal and the RF reference signal.

In block S314, the reference frequency and phase of the RF reference signal generated by the reference source 215 are adjusted by the PLL 240 to be substantially the same as a calibration frequency and phase of the first RF calibration signal, and locked by the PLL 240. That is, the PLL filter 245 receives the first calibration phase signal output by the mixer 210 as feedback, and adjusts the reference frequency and phase of the RF reference signal at the reference source 215 toward the calibration frequency of the first RF calibration signal. When the calibration frequency and phase and the reference frequency and phase are respectively substantially the same, the output of the mixer 210 indicates phase noise of the first RF calibration signal. The PLL 240 is kept active.

In block S315, a second RF calibration signal received from the calibration source at the RF port and the phase locked RF reference signal received from the reference source 215 at the LO port are mixed at the mixer 210 to provide a second calibration phase signal. The second calibration phase signal is summed with the DC signal output by the DAC 220 by the adder 230, and output by the phase noise measurement system 200 as the output signal s(t) after low pass filtering and amplification. The second calibration phase signal indicates a phase difference between the second RF calibration signal and the RF reference signal.

The second RF calibration signal includes one-tone AM modulation inserted by the RF source 205, where the predetermined modulation tone frequency of the single tone is $\omega_{AM}$. The modulation tone frequency $\omega_{AM}$ may be set to a value somewhere (~geometric mean) in the range of the phase noise offset frequency that is to be measured. For example, a modulation tone frequency $\omega_{AM}$ equal to 100 kHz may be selected when the offset frequency range is 100 Hz to 10 MHz. Accordingly, the second calibration phase signal also includes the one-tone AM modulation. In an embodiment, the first RF calibration signal may also include the one-tone AM modulation, in which case the second RF calibration signal is the same as the first RF calibration signal.

In block S316, the output signal s(t) output by the phase noise measurement system 200 is monitored at the modulation tone frequency of the single tone. For example, the output signal s(t) may be monitored by the test instrument 250 (e.g., spectrum analyzer or oscilloscope). Based on the monitoring of the output signal s(t), the DC voltage output by the DAC 220 is adjusted in block S317 in order to minimize the tone level (e.g., voltage level, current level, power level) of the single tone at the modulation tone frequency when the DC signal and the second calibration phase signal are summed by the adder 230. The DC voltage may be adjusted manually by the user, or automatically using application firmware and/or using software stored as instructions on a non-transitory computer readable medium and executable by a computer processor (not shown), for example, as would be apparent to one skilled in the art. The minimized tone level indicates optimum AM noise rejection of the phase noise measurement system 200.

In block S318, a DUT is provided as the RF source 205, replacing the calibration source. The DUT provides a test signal as the input signal, where the test signal is generated by the DUT. In block S319, the test signal received from the DUT at the RF port and the RF reference signal received from the reference source 215 at the LO port are mixed by the mixer 210 to provide a measurement phase signal. The RF reference signal has the locked reference frequency and phase from block S314. The test signal does not include the one-tone AM modulation.

In block S320, absolute phase noise of the test signal is measured using the measurement phase signal and the adjusted DC voltage output by the DAC from block S317.

Figure 4:
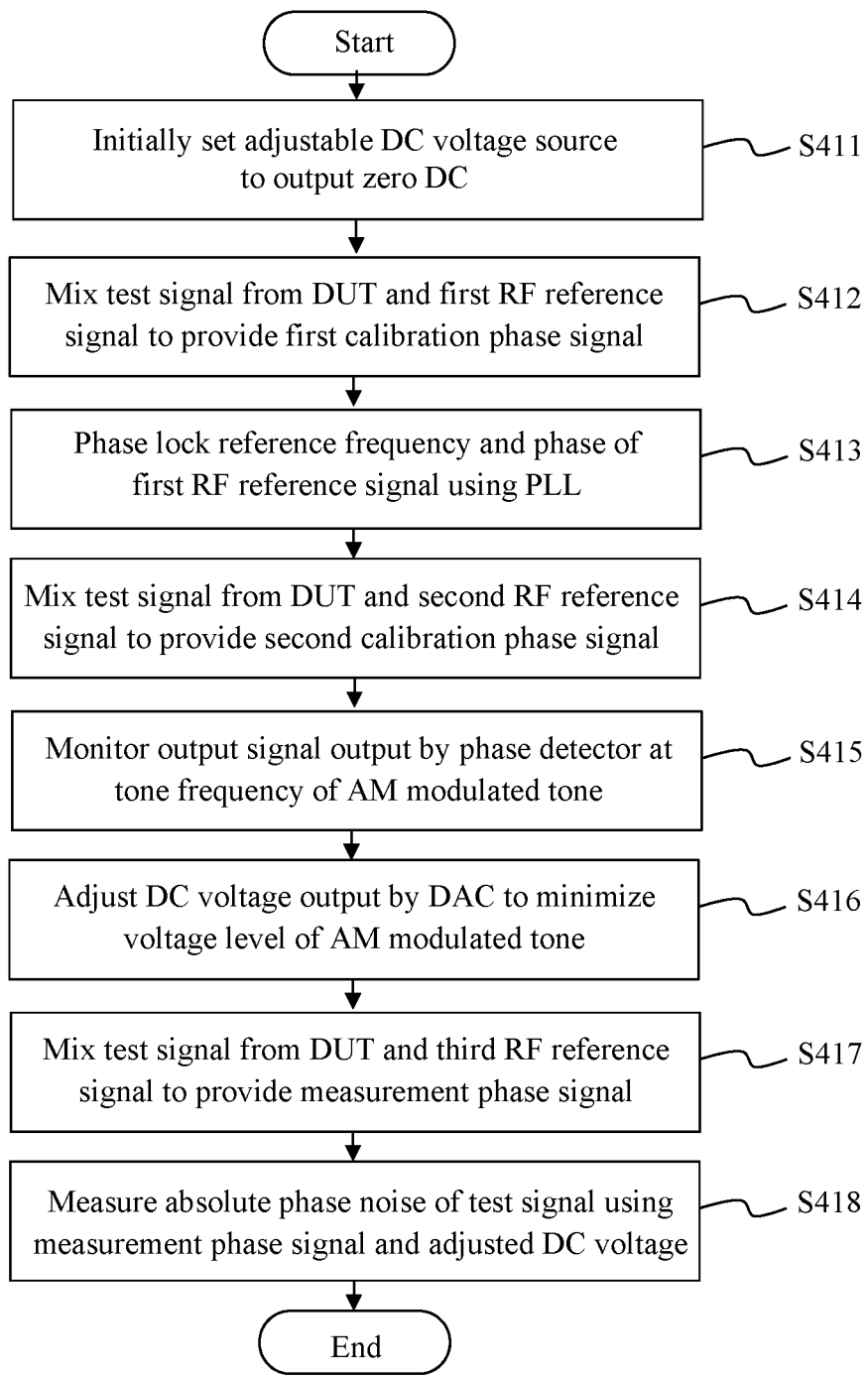
FIG. 4 is a flow diagram of a method of measuring absolute phase noise of a test signal from a DUT using a reference source providing one-tone AM modulation and an adjustable DC voltage source for improved AM noise rejection, according to a representative embodiment.

FIG. 4 is a flow diagram of a method of measuring absolute phase noise of a test signal from a DUT using a reference source having one-tone AM modulation and an adjustable DC voltage source for improved AM noise rejection, according to a representative embodiment.

Referring to FIGS. 2 and 4, an adjustable DC voltage source, such as the DAC 220, is initially set to output zero DC in block S411. The DC voltage output by the DAC 220 may be adjusted manually by the user, or may be automated in measurement firmware and/or in software stored as instructions on a non-transitory computer readable medium and executable by a computer processor, for example, as would be apparent to one skilled in the art.

In block S412, a test signal received from the DUT at the RF port and a first RF reference signal received from the reference source 215 at the LO port are mixed at the mixer 210 to provide a first calibration phase signal. The test signal is generated by the DUT. The reference source 215 is able to perform one-tone AM modulation, as discussed below, and may be implemented as an arbitrary signal generator or a DDS, for example. The first calibration phase signal may be summed with the DC signal output by the DAC 220 by the adder 230, and output by the phase detector 200 as the output signal s(t) after low pass filtering and amplification. As a practical matter, the summing has no effect on the first calibration phase signal since the DC signal has initially been set to zero DC. The first calibration signal indicates a phase difference between the test signal and the first RF reference signal.

In block S413, the reference frequency and phase of the first RF reference signal generated by the reference source 215 is locked by the PLL 240 when the reference frequency and phase are adjusted to be substantially the same as a test frequency and phase of the test signal. That is, the PLL filter 245 receives the first calibration signal output by the mixer 210 as feedback, and adjusts the reference frequency and phase of the RF reference signal at the reference source 215 toward the calibration frequency and phase of the first RF calibration signal. When the calibration frequency and phase and the reference frequency and phase are respectively substantially the same, they are phase locked, and the output of the mixer 210 indicates phase noise of the first RF calibration signal. The PLL 240 is kept active.

In block S414, the test signal received from the DUT at the RF port and a phase locked second RF reference signal received from the reference source 215 at the LO port are mixed by the mixer 210 to provide a second calibration phase signal. The second calibration phase signal is summed with the DC signal output by the DAC 220 by the adder 230, and output by the phase noise measurement system 200 as the output signal s(t) after low pass filtering and amplification. The second calibration phase signal indicates a phase difference between the test signal and the second RF reference signal.

The second RF reference signal includes one-tone AM modulation inserted by the reference source 215, where the predetermined modulation tone frequency of the single tone is $\omega_{AM}$. Accordingly, the second calibration phase signal also includes the single tone at the modulation tone frequency $\omega_{AM}$. In an embodiment, the first RF reference signal may also include the one-tone AM modulation, in which case the second RF reference signal is the same as the first RF reference signal.

In block S415, the output signal s(t) output by the phase noise measurement system 200 is monitored at the modulation tone frequency $\omega_{AM}$ of the single tone. For example, the output signal s(t) may be monitored by the test instrument 250 (e.g., spectrum analyzer or oscilloscope). Based on the monitoring of the output signal s(t), the DC voltage output by the DAC 220 is adjusted in block S416 in order to minimize the tone level of the single tone at the modulation tone frequency $\omega_{AM}$ when the DC signal and the second calibration phase signal are summed by the adder 230. The DC voltage may be adjusted manually by the user, or automatically using application firmware and/or using software stored as instructions on a non-transitory computer readable medium and executable by a computer processor (not shown), for example, as would be apparent to one skilled in the art. The minimized tone level at the mixer output indicates optimum AM noise rejection of the phase noise measurement system 200.

In block S417, the test signal received from the DUT at the RF port and a phase locked third RF reference signal received from the reference source 215 at the LO port are mixed by the mixer 210 to provide a measurement phase signal. The third RF reference signal does not include the one-tone AM modulation, and includes the locked reference frequency from block S413. In block S418, absolute phase noise of the test signal is measured using the measurement phase signal and the adjusted DC voltage output by the DAC 220.

Figure 5:
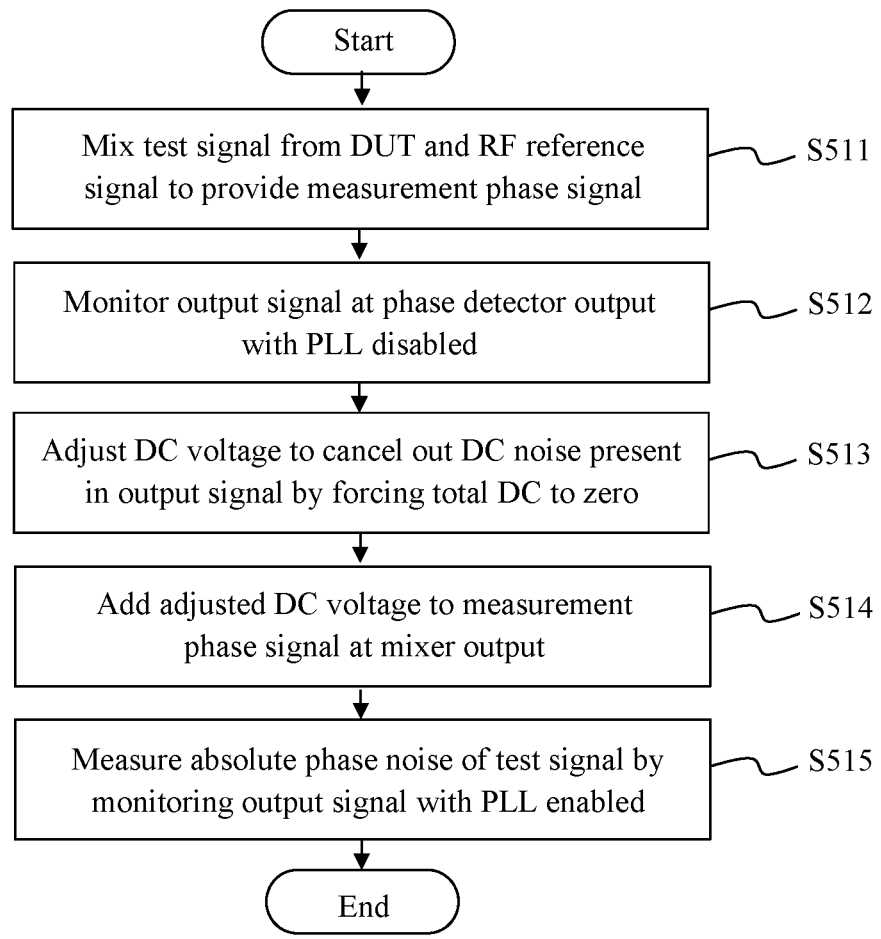
FIG. 5 is a flow diagram of a method of measuring absolute phase noise of a test signal from a DUT using an adjustable DC voltage source for improved AM noise rejection, according to a representative embodiment.

FIG. 5 is a flow diagram of a method of measuring absolute phase noise of a test signal from a DUT using an adjustable DC voltage source, according to a representative embodiment.

Referring to FIGS. 2 and 5, a test signal received from the DUT at the RF port and an RF reference signal received from the reference source 215 at the LO port are mixed at the mixer 210 to provide a measurement phase signal in block S511. The test signal is generated by the DUT. Also, a reference frequency of the RF reference signal is set close to a test frequency of the test signal, meaning that the reference frequency is within +/−10 MHz of the test frequency. The measurement phase signal may be summed with the DC signal output by the DAC 220 by the adder 230, and output by the phase noise measurement system 200 as the output signal s(t) after low pass filtering and amplification. The measurement phase signal indicates a phase difference between the test signal and the RF reference signal.

In block S512, the output signal is monitored at the output of the phase detector with the PLL disabled. In particular, the DC voltage level of the output signal is monitored, for example, using an analog to digital converter (ADC) or a voltmeter (not shown), or a spectrum analyzer or oscilloscope.

Based on the monitoring, the DC voltage output by the DAC 220 is adjusted in block S513 to cancel out the DC voltage level present in the output signal, forcing total DC to zero. It may be assumed that other DC errors have been cancelled earlier in the absence of input signals. Adjusting the DC voltage output by the DAC may be done manually by the user or automated by firmware or software, discussed above.

In block S514, the adjusted DC voltage is added to the measurement phase signal at the output of the mixer by the adder 230 to provide a DC error adjusted output signal s(t). Absolute phase noise of the test signal is then measured by monitoring the output signal with the PLL enabled and the adjusted DC voltage added to the output signal in block S515.

Referring again to FIG. 2, the phase noise measurement system 200 may optionally include another DAC 220' (indicated by dashed lines) at the LO input of the mixer 210. The DAC 220' is configured to inject a variable DC voltage in the LO input for controlling DC bias (DC offset) of a switch circuit in the mixer 210 driven by the LO signal (e.g., RF reference signal). The switch circuit may comprise one or more transistors, for example. Adjusting the DC voltage output by the DAC 220' changes the duty cycle of the LO signal, which determines the $2^{nd}$ order nonlinearity of the mixer 210.

The $2^{nd}$ order nonlinearity of the mixer 210 affects the tone level of the single tone of the one-tone AM modulation in the calibration signal (e.g., second RF calibration signal). Generally, the closer the duty cycle is to 50 percent, the smaller the $2^{nd}$ order nonlinearity and the lower the tone level of the single tone. So, adjusting the DC voltage output by the DAC 220' while the PLL 240 is kept active, in addition to adjusting the DC voltage output by the DAC 220 in blocks S317, S416 and S513, discussed above, assists in further minimizing the tone level of the single tone at the modulation tone frequency. This may be referred to as second-order intercept point (IP2) calibration. Adjusting the DC voltage from the DAC 220' during the IP2 calibration may be performed substantially at the same time as adjusting the DC voltage from the DAC 220 to the adder 230.

In an embodiment, the phase noise measurement system may be a dual-channel system configured to perform cross-correlation for improving reference phase noise suppression and improving suppression of noise added by mixer and components after the mixer. The dual-channel phase noise measurement system includes two mixers (phase detectors) 210, two reference sources 215, two PLLs 240, and two LNAs 235. Each of the mixers 210 is configured to receive simultaneously the input signal output by the RF source 205 at its RF port and an RF reference signal output by the respective reference source 215 at its LO port, to mix the input signal and the respective RF reference signal, and to output a phase signal at its IF port.

The dual-channel phase noise measurement system further includes two low-noise DACs 220 and adders 230 at the outputs of the mixers 210, respectively. Each DAC 220 is configured to output a variable DC voltage, which is added to the phase signal by the corresponding adder 230 at a predetermined frequency. The DC voltage output by each DAC 220 thereby adjusts the voltage level of the phase signal at the IF port of the corresponding mixer 210. The PLLs 240 provide phase locking tune voltage signals from the adders 230 to the respective the reference sources 215 as feedback in order to maintain 90 degree quadrature between the each of the RF reference signals and the RF input signal at the mixers 210. The outputs of the LNAs 235 are cross-correlated, and output as the output signal or waveform s(t) from the dual-channel phase noise measurement system. As discussed above, the DACs 220 of each channel are adjusted for optimum AM rejection. The cross-correlation enables suppression of phase noise of reference sources and mixers, and noise generated in the IF path after the mixers.

Referring again to FIG. 1A, the polarity of the AM conversion gain for relative phase between the RF and LO inputs, shown by trace 102, is negative for relative phase greater than 90 degrees and positive for relative phase less than 90 degrees. During cross-correlation using the dual-channel absolute phase noise measurement system, it is desirable to have the same polarity for each of the two channels in order to avoid a phenomenon known as "cross-spectral collapse," which may occur when the AM noise partially cancels the PM noise during cross-correlation and gives a wrong phase noise measurement at frequency offsets where the AM conversion gain polarities are opposite in the two channels. During adjustment of the AM null at the output of mixer 210 of each channel, the adjustment is done in the same direction for each channel, and the adjustment is stopped immediately after the minimum tone level from the AM modulation starts to increase again from the minimum value. This ensures that the relative phase between RF and LO inputs for each channel are either both slightly greater than 90 degrees or slightly less than 90 degrees.

Residual Phase Noise Measurements

Various embodiments mitigate AM and PM noise of stimulus signals input to a DUT and AM noise of test signals output by the DUT in response to the stimulus signals. The test signals are input to a phase detector for measuring residual phase noise. The PM noise of the stimulus signals and the AM noise of the stimulus signals and test signals otherwise raise the noise floor of a residual phase noise measurement system. The residual phase noise measurement limit for a DUT is typically 10 dB above the phase noise floor of the residual phase noise measurement system for the error to be within 0.5 dB.

In one embodiment, the system phase noise floor is lowered for phase noise due to the stimulus PM noise. The stimulus PM noise shows up more pronounced at larger frequency offsets from a stimulus carrier frequency due to a loss in time-coherence at the phase detector inputs between the RF and LO signal paths. This method helps to mitigate and overcome the high phase noise of signal sources used for generating stimulus signals, such as E8257D PSG Analog Signal Generator, available from Keysight Technologies, Inc., for example.

In another embodiment, the system phase noise floor is lowered for AM noise due to the stimulus and DUT noise leaking to the phase detector output due to poor AM rejection by the phase detector. This embodiment overcomes large AM noise of signal sources, such as the E8257D PSG Analog Signal Generator, that otherwise degrades the residual phase noise floor, especially in an offset range of 1 kHz to 1 MHz from the carrier frequency. The method also helps to mitigate any high AM noise associated with the DUT.

In another embodiment, a PLL is used to drive a line stretcher in order to automate the quadrature setting process of the phase detector. Line stretchers are adjusted manually in conventional phase noise detection systems, such the N5511A phase noise test system, for example, in order to perform residual phase noise measurements. For example, an electronically adjusted (e.g., motorized or electronically switched) delay line may be controlled by the PLL to achieve desired line lengths automatically.

Conventional residual phase noise measurement systems may be able to measure residual phase noise, but cannot measure and compensate for RF and LO signals relative delay at the phase detector inputs. Such compensation would improve time-coherence and suppress stimulus phase noise from contributing to the phase noise floor of the residual phase noise measurement system. Also, conventional network analyzers, such as the PNA-X series, available from Keysight Technologies, Inc., for example, are unable to measure residual phase noise with a deep noise floor. When there is no compensation of the RF and LO relative delay, the stimulus phase noise is not suppressed, which noise drastically increases the phase noise floor with increasing frequency offset, going well above the residual phase noise of the DUT, and also increases above the thermal noise floor.

The AM noise of the stimulus signals and the DUT add to the AM related phase noise floor of the residual phase noise measurement system due to poor AM rejection of the phase detector used for demodulating the phase noise. For example, a conventional residual phase noise measurement system may have AM rejection of only about 16 dB. This implies that the DUT residual phase noise measurement limit is only about 6 dB below the AM noise level of the stimulus signal when keeping a measurement error limit due to AM noise at 0.5 dB.

Referring first to stimulus phase noise which increases the system phase noise floor, conventional residual phase noise measurement systems include a stimulus source that generates a stimulus signal that drives a DUT to provide a test signal. Residual (additive) phase noise of the test signal is measured at the output of a phase detector (e.g., mixer). That is, the phase detector mixes the test signal from the DUT received in an RF path and the stimulus signal from the stimulus source received in an LO path. The LO signal is in phase quadrature with the test signal. The quadrature may be maintained by adjusting relative delay between the RF and LO paths to be an odd integer n multiple of 90 degrees at the stimulus frequency of the stimulus signal. Due to this finite relative delay, there is loss of correlation between stimulus phase noise at the RF and LO ports. Generally, n is much greater than 1 due to delays in the DUT and RF cables, leading to large leakages of stimulus noise at the output of the phase detector, as shown in FIG. 6, for example.

Figure 6:
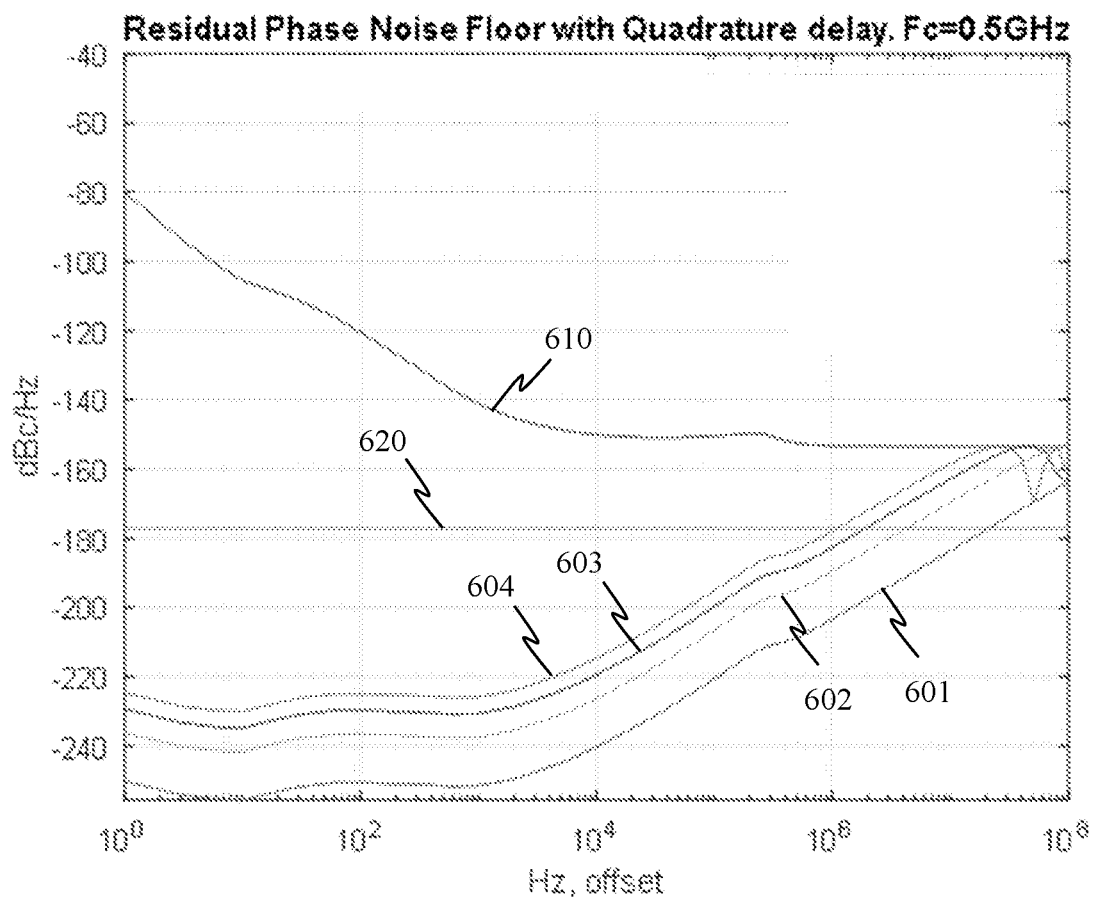
FIG. 6 is a graph showing residual phase noise floor due to stimulus phase noise as a function of quadrature delays at a phase detector.

FIG. 6 is a graph showing phase noise floors due to stimulus phase noise as a function of quadrature delays at a phase detector. Referring to FIG. 6, residual phase noise measured in dB is shown as a function of frequency offset from the carrier frequency of the stimulus signal measured in Hz. Trace 610 shows the phase noise of the stimulus signal, and trace 620 shows the thermal noise floor of the phase detector. Traces 601 to 604 show the residual phase noise at the output of the phase detector for different delays, indicated by odd integer multiples n. That is, in the depicted example, trace 601 is the residual phase noise for n=1, trace 602 is the residual phase noise for n=3, trace 603 is the residual phase noise for n=5, and trace 604 is the residual phase noise for n=9.

Generally, the goal of the residual phase noise measurement system is to have the minimum delay, e.g., corresponding to n=1 as indicated by trace 601. As the value of n increases, the delay increases, which results in the stimulus related phase noise floor increasing at the phase detector output as indicated by traces 602, 603 and 604. The phase noise floor breaks out above the thermal noise floor trace 620 at lower frequency offsets for the higher values of n. To achieve n=1 (or some other acceptably low values of n) for the best residual phase noise suppression, the RF and LO relative delay must be measured, which is conventionally done using a network analyzer with time domain reflectometry (TDR) measurement capability. This is expensive and requires additional measurement time and set up. Accordingly, there is a need to be able to measure the relative delay in-situ during the phase noise measurement without using a network analyzer.

Figure 7:
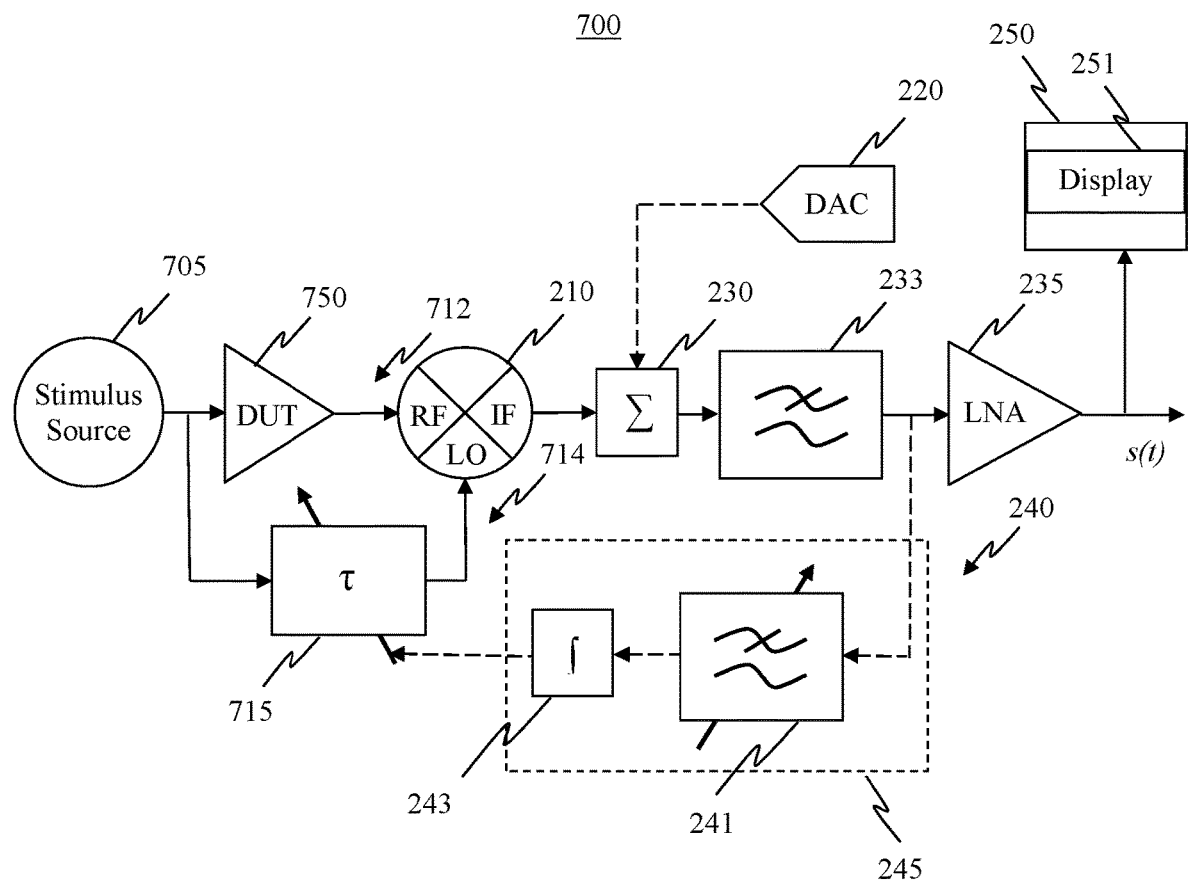
FIG. 7 is a simplified block diagram showing a residual phase noise measurement system with reduced PM and AM noise, according to a representative embodiment.

The various embodiments described below improve the residual phase measurement system's handling of AM and PM noise of a stimulus signal from a stimulus source and AM noise of a test signal from a DUT in response to the stimulus signal, so that these PM and AM noise are suppressed to well below the residual phase noise of the DUT. FIG. 7 is a simplified block diagram showing a residual phase noise measurement system with reduced PM and AM noise, according to a representative embodiment.

According to representative embodiments, a system and method are provided for measuring residual phase noise of a test signal from a DUT using a phase detector including a mixer having an RF port and an LO port. The method includes injecting a phase noise spur in a stimulus signal generated by a stimulus source, where the phase noise spur has a known magnitude at a known frequency offset from a carrier frequency of the stimulus signal; inputting the stimulus signal with the phase noise spur to the DUT, where the DUT outputs a test signal, including the phase noise spur, in response to the stimulus signal; inputting the test signal to the RF port of the mixer via an RF path, and inputting the stimulus signal to the LO port of the mixer via an LO path; mixing the test signal and the stimulus signal to provide a residual phase noise signal at an output of the mixer; measuring actual rejection of stimulus phase noise from the stimulus signal at the know frequency offset of the phase noise spur in the residual phase noise signal; determining a relative delay between the test signal and the stimulus signal in the RF and LO paths based on the actual rejection of the stimulus phase noise; and minimizing the relative delay between the test signal and the stimulus signal in order to reduce a stimulus related phase noise floor of the phase detector.

According to other representative embodiments, a system and method are provided for measuring residual phase noise of a test signal from a DUT using a phase detector including a mixer having an RF input and an LO input. The method includes inputting a stimulus signal generated by a stimulus source to the DUT, where the DUT outputs a test signal in response to the stimulus signal; inputting the test signal to an RF port of the mixer via an RF path, and the stimulus signal to an LO input of the mixer via an LO path; mixing the test signal and the stimulus signal to provide a residual phase noise signal at an output of the mixer; establishing an initial quadrature phase at the mixer based on monitoring DC voltage in the residual phase noise signal; turning on one-tone AM modulation in the stimulus signal at the stimulus source; monitoring a modulation tone frequency of a tone for the one-tone AM modulation in the residual phase noise signal; adjusting the initial quadrature phase at the mixer to obtain a measurement quadrature phase by minimizing a voltage level of the tone while monitoring of the modulation tone frequency; inputting a stimulus signal generated by the stimulus source, without the one-tone modulation, to the DUT, where the DUT outputs a test signal in response to the stimulus signal; and mixing the test signal and the stimulus signal using the measurement quadrature phase to provide a residual phase noise signal at the output of the mixer, thereby significantly reducing AM noise in the residual noise signal.

Referring FIG. 7, a single-channel residual phase noise measurement system 700 includes the mixer (phase detector) 210 as described above, as well as a stimulus source 705 and a delay circuit 715. The stimulus source 705 is configured to generate and output a stimulus signal, and may be implemented as an AWG or DDS, for example. The stimulus signal is received as an input signal to a DUT 750, which outputs a test signal in response to the received stimulus signal. The stimulus signal is also received by the delay circuit 715, which is configured to delay the stimulus signal by a variable delay amount, as discussed below. The delay circuit 715 may be implemented as a voltage controlled or electronically controlled delay line, for example.

The mixer 210 is configured to receive the test signal output by DUT 750 at the RF port and the delayed stimulus signal output by the delay circuit 715. The mixer 210 mixes the test signal and the delayed stimulus signal, and outputs a phase signal at the IF port. Ideally, the test signal is 90 degrees out of phase with the delayed stimulus signal. The DAC 220 and the PLL filter 245 are indicated by dashed lines as they are not necessarily required for some embodiments.

Figure 8:
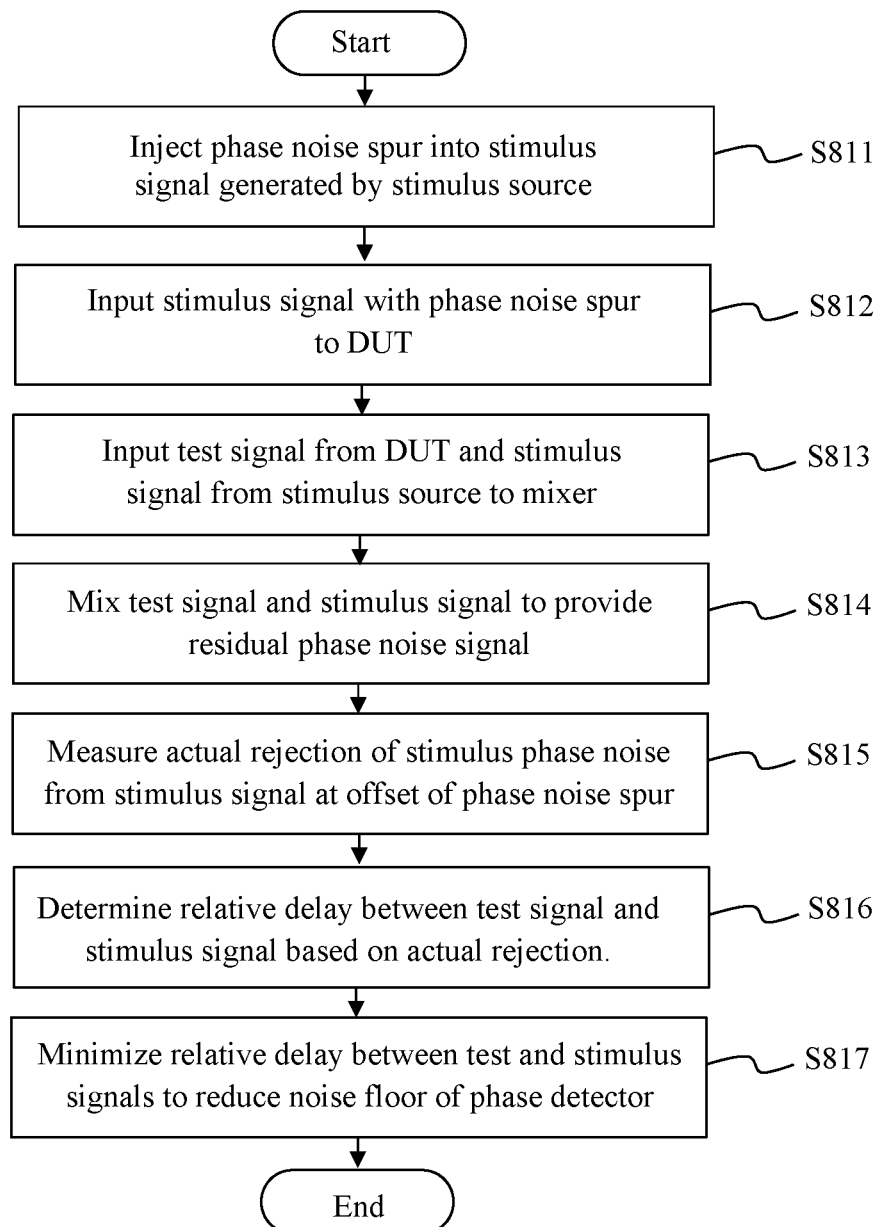
FIG. 8 is a flow diagram of a method of measuring residual phase noise of a test signal from a DUT using an adjustable delay circuit for reducing PM noise from a stimulus signal, according to a representative embodiment.

FIG. 8 is a flow diagram of a method of measuring residual phase noise of a test signal from a DUT using an adjustable delay circuit for reducing PM noise from a stimulus signal, according to a representative embodiment.

Referring to FIGS. 7 and 8, a phase noise spur is created at the stimulus signal generated by the stimulus source 705 at block S811. The phase noise spur may be generated using single tone phase modulation of a carrier to create a double sideband (DSB) modulated signal, for example. Each sideband of the phase noise spur has a known magnitude relative to the carrier level, at a known frequency offset from the carrier frequency of the stimulus signal.

In block S812, the stimulus signal with the phase noise spur is input to the DUT 750. The DUT 750 outputs a test signal, which likewise includes the phase noise spur, in response to the input stimulus signal.

In block S813, the test signal is input to the RF port of the mixer 210 via an RF path 712, and the stimulus signal is input to the LO port of the mixer 210 via an LO path 714. In block S814, the test signal at the RF port and the stimulus signal at the LO port are mixed at the mixer 210 to provide a residual phase noise signal at an IF output of the mixer 210. Actual rejection of the stimulus phase noise (i.e., stimulus phase noise suppression) from the stimulus signal is measured in block S815 by measuring the phase noise spur at the know frequency offset of the phase noise spur from the carrier frequency of the stimulus signal in the residual phase noise signal.

In block S816, a relative delay ($\tau$) between the test signal and the stimulus signal in the RF path 712 and the LO path 714 is determined based on the actual rejection of the stimulus phase noise spur. In an embodiment, the relative delay between the test signal and the stimulus signal may be determined by first determining a quadrature delay multiplier (n) from the actual rejection of the stimulus phase noise spur, the known frequency offset, and the carrier frequency of the stimulus signal, and then calculating the relative delay from the quadrature delay multiplier and the carrier frequency of the stimulus signal.

For example, a value of the quadrature delay multiplier n may be determined from Equation (1), where AR is the actual rejection of the stimulus phase noise spur, $\omega_m$ is the known offset frequency, $\omega_c$ (or $2\pi f_c$) is the carrier frequency of the stimulus signal, and n is an odd integer:

$$AR = 20 * \log_{10}\left[4\sin^2\left(\left[n\frac{\pi}{2}\right]\frac{\omega_m}{2\omega_c}\right)\right] \quad \text{Equation (1)}$$

Once the quadrature delay multiplier n is determined using Equation (1), this value may be plugged into Equation (2) in order to calculate the relative delay $\tau$:

$$\tau = n\frac{\pi}{2\omega_c} = \frac{n}{4f_c} \quad \text{Equation (2)}$$

In block S817, the relative delay between the test signal and the stimulus signal is minimized in order to reduce the residual phase noise measurement floor of the phase detector. In the depicted embodiment, the relative delay is minimized by adjusting the delay of the stimulus signal at the delay circuit 715 in the LO path 714. For example, the relative delay between the test signal and the stimulus signal may be minimized to $$\tau 0 = 1\frac{\pi}{2\omega_c} = \frac{1}{4f_c}$$

by adjusting a line length of the delay circuit 715 to increase or decrease the delay of the stimulus signal to obtain the minimized relative delay. The amount of delay adjustment is then $\tau-\tau 0$. Typically, the delay per unit length of the RF/microwave cables at the carrier frequency is known, and the change in cable length required to achieve a relative delay of $\tau 0$ is determined based on this known delay per unit length. Programmable line stretchers can be calibrated for delay versus length or versus an adjustment readout. In alternative configurations, the RF path 712 may include a delay circuit, in addition to or in place of the delay circuit 715, enabling reduction of the relative delay through delay adjustments to one or both of the RF path 712 and the LO path 714.

In alternative embodiments, the value of the quadrature delay multiplier n may be determined by other methods. For example, the residual phase noise floor may be measured using a stimulus signal with high wideband phase noise, with multitone orthogonal frequency-division multiplexing (OFDM), or with closely spaced tones using IQ modulation. Or, wideband white phase noise modulation may be enabled at stimulus source 705 (or at a second stimulus source with wideband phase modulation) using IQ modulation.

In this case, the residual phase noise is measured, and nulls and peaks of Equation (1) are used to determine the value of the quadrature delay multiplier n for the existing relative delay τ. That is, the odd value of the quadrature delay multiplier n may be determined by looking at the first null frequency offset ($f_{null}$) according to Equation (3), or at the first peak frequency offset ($f_{peak}$) according to Equation (4), in the residual phase noise plot measured at the carrier frequency ($f_c$) of the stimulus signal:

$f_{null}=4*f_c/n$ $n=4*f_c/f_{null}$            Equation (3)

$f_{peak}=2*f_c/n$ $n=2*f_c/f_{peak}$            Equation (4)

Again, once the value of the quadrature delay multiplier is determined, relative delay τ can be calculated according to Equation (2), above.

Figure 9:
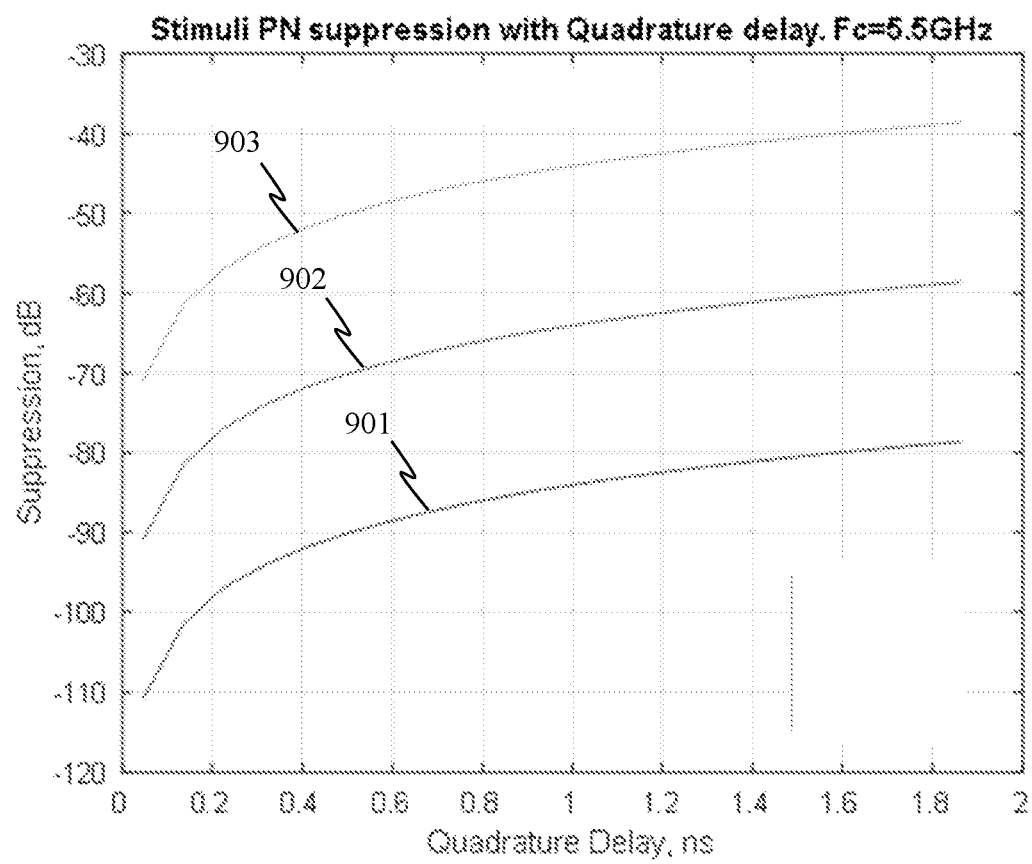
FIG. 9 is a graph showing suppression of stimulus phase noise and stimulus phase noise spur at three frequency offsets for a phase detector as a function of relative (quadrature) delay between RF and LO paths.

FIG. 9 is a graph showing suppression of stimulus phase noise and stimulus phase noise spur at three frequency offsets for a phase detector as a function of relative (quadrature) delay between RF and LO paths. Referring to FIG. 9, trace 901 shows suppression of stimulus phase noise in dB for a frequency offset of 10 KHz, trace 902 shows suppression of stimulus phase noise a frequency offset of 100 KHz, and trace 903 shows suppression of stimulus phase noise for a frequency offset of 100 KHz. As indicated by each of these traces, the stimulus phase noise suppression is greater the smaller the relative delay between the RF and LO paths. For example, referring to trace 901, the stimulus phase noise suppression at a relative delay of 1.2 ns is about −98 dB, while the stimulus phase noise suppression at a relative delay of 1.8 ns is only about −79 dB. Accordingly, minimizing the relative delay as in the present embodiment improves the stimulus phase noise suppression.

In a related embodiment, a one-tone phase modulation is provided by the stimulus source 705 at swept offset frequencies from the carrier of the stimulus signal. The residual phase noise measurement system 700 measures the response at the output of the mixer 210 to confirm the value of the quadrature delay multiplier n at the frequency offsets. Alternatively, the stimulus source 705 may generate a multitone stimulus signal instead of swept tone. A fitting to Equation 1 may then be performed by firmware and/or by software, stored as instructions on a non-transitory computer readable medium and executable by a computer processor, for example, to determine the value of quadrature delay multiplier n, which thereby changes the delay circuit 715 (e.g., transmission line lengths) to get n=1. This fitting process may be manual as well, where the output of the mixer 210 at 10 kHz, 100 kHz and 1 MHz frequency offsets, for example, is minimized for a 3-tone phase modulated stimulus signal, the delay circuit 715 is adjusted, and the rejections are measured.

In an alternative embodiment, the delay circuit 715 may be implemented as a line stretcher, which is motorized and electronically driven or switched. In this case, the relative delay between the test signal and the stimulus signal may be minimized by automatically phase adjusting the line stretcher using the PLL 240 in order to increase or decrease the delay of the stimulus signal to obtain the minimized relative delay. That is, the PLL 240 drives the line stretcher to automate the quadrature settings for adjusting the relative delay.

Referring again to FIG. 7, for example, DC error voltage arises from the output of the mixer 210 at the IF port. This DC error voltage is provided to the line stretcher through the PLL 240, and used to steer the phase adjustment of the line stretcher. For example, the line stretcher may be servo controlled, in which case the phase value (relative delay) may be directly set based on the DC error voltage. The DC error voltage is sampled periodically to implement a digital control loop, where the sampling frequency is much higher than the loop bandwidth. After establishing phase quadrature, the PLL 240 may be disabled in order to reduce noise in the residual phase noise measurements.

Figure 10:
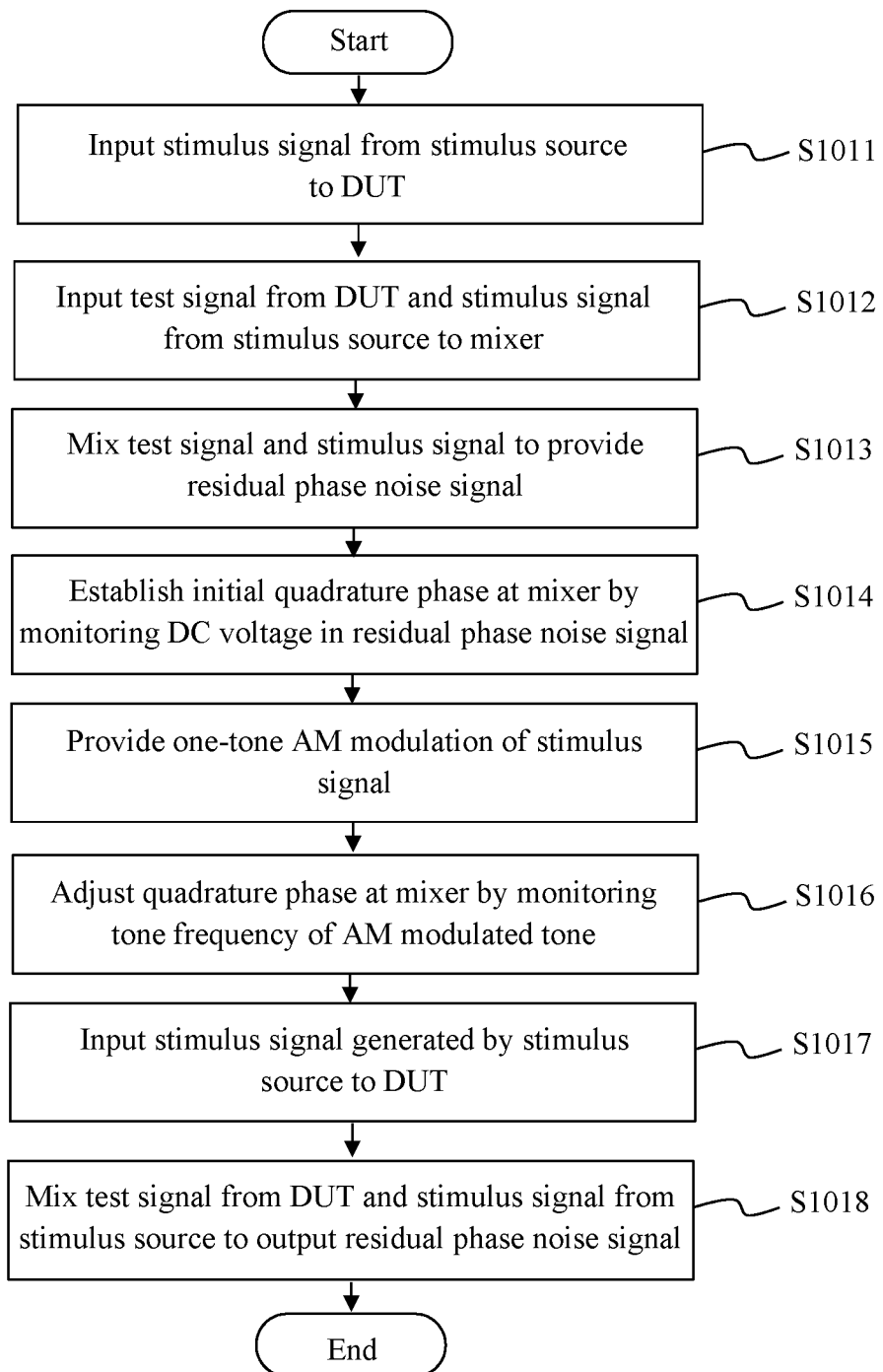
FIG. 10 is a flow diagram of a method of measuring residual phase noise of a test signal from a DUT using an adjustable delay circuit for reducing AM noise from a stimulus signal and a test signal, according to a representative embodiment.

As stated above, in addition to stimulus PM noise from the stimulus signal, another contributor to the noise floor of the residual phase noise measurement system 700 is AM noise from both the stimulus signal output by the stimulus source 705 and the test signal output by the DUT 750. FIG. 10 is a flow diagram of a method of measuring residual phase noise of a test signal from a DUT using an adjustable delay circuit for reducing AM noise from a stimulus signal and a test signal, according to a representative embodiment.

Referring to FIGS. 7 and 10, a stimulus signal generated by the stimulus source 705 is input to the DUT 750 in block S1011. The DUT 750 outputs a test signal in response to the stimulus signal.

In block S1012, the test signal output from the DUT 750 is input to an RF port of the mixer 210 via the RF path 712, and the stimulus signal from the stimulus source 705 is input to an LO port of the mixer 210 via the LO path 714. The test signal and the stimulus signal are mixed by the mixer 210 in block S1013 to provide a residual phase noise signal at the output of the mixer 210.

In block S1014, an initial quadrature phase is established for the mixer 210 by monitoring a DC voltage in the residual phase noise signal at the output of the residual phase noise measurement system 700. For example, the residual phase noise signal may be monitored using a voltmeter or ADC. The initial quadrature phase is then set by adjusting the delay circuit 715.

In block S1015, one-tone AM modulation is turned on in the stimulus source 705 to provide one-tone AM modulation of the stimulus signal. The single tone of the one-tone AM modulated calibration stimulus signal has a predetermined modulation tone frequency $\omega_{AM}$.

In block S1016, the initial quadrature phase at the mixer 210 is adjusted from its initial value to obtain a measurement quadrature phase by minimizing the tone level (e.g., voltage level, current level, power level) of the single tone at the modulation tone frequency $\omega_{AM}$ in the residual phase noise signal while monitoring the modulation tone frequency $\omega_{AM}$ at the mixer output. The residual phase noise signal may be monitored at the output of the residual phase noise measurement system 700 by the test instrument 250 (e.g., spectrum analyzer or oscilloscope) centered at modulation tone frequency $\omega_{AM}$, for example. The tone level of the tone may be minimized by slightly adjusting the relative delay from the initial value of the quadrature phase between the test signal and the calibration stimulus signal. This adjustment of delay circuit 715 does not minimize the relative delay between the test signal and the stimulus signal, but ensures that quadrature phase is established at an odd value of n. For example, the relative delay between the test signal and the calibration stimulus signal may be reduced by manually adjusting a line length of the delay circuit 715 to increase or decrease the delay of the stimulus signal to obtain the desired relative delay to provide the quadrature phase between the RF and LO inputs of the mixer 210.

In alternative configurations, the RF path 712 may include a delay circuit, in addition to or in place of the delay circuit 715, enabling reduction of the relative delay through delay adjustments to one or both of the RF path 712 and the LO path 714. Or, as discussed above, the delay circuit 715 may be implemented as a line stretcher, where the relative delay between the calibration test signal and the calibration stimulus signal may be minimized by automatically phase adjusting the line stretcher using the PLL 240.

In an embodiment, residual phase noise measurement system 700 includes the DAC 220 for outputting a DC voltage to the output of the mixer 210, as well as the PLL 240 for maintaining the 90 degree quadrature between the calibration measurement signal and the calibration stimulus signal. In this case, adjusting the initial quadrature phase at the mixer may include adjusting the DC voltage output by the DAC 220 to minimize a voltage level of the AM modulation tone frequency of the single tone being monitored. In particular, the adjusted DC voltage changes the operating point of the PLL 240 to a new adjusted phase shift to provide the measurement quadrature phase at the mixer. The DC voltage output by the DAC 220 may be adjusted, for example, using a closed loop control based on the tone level of the single tone at the modulation tone frequency being monitored.

In block S1017, a stimulus signal generated by the stimulus source 705 is input to the DUT 750, where the stimulus signal has no one-tone AM modulation. The DUT 750 outputs a test signal in response to the stimulus signal.

In block S1018, the test signal from the DUT 750 and the stimulus signal from the stimulus source 705 are mixed at the mixer 210 using the measurement quadrature phase. The mixer 210 outputs a residual phase noise signal with significantly reduced AM noise.

In an embodiment, the residual phase noise measurement system may be a dual-channel system configured to perform cross correlation for lowering the noise floors contributed by the mixers and the IF stages noise. The dual-channel residual phase noise measurement system includes two mixers (phase detectors) 210, two delay circuit 715, two PLLs 240, and two LNAs 235. Each of the mixers 210 is configured to receive simultaneously the test signal output by the DUT 750 at its RF port and the stimulus signal output by the stimulus source 705 at its LO port, to mix the test signal and the stimulus signal, and to output a phase signal at its IF port.

The PLLs 240 provide phase locked tune voltage signals from the mixers 210 to the respective delay circuits 715 as feedback in order to maintain 90 degree quadrature between the test signals and the stimulus signals at the mixers 210. The 90 degree quadrature may be maintained by minimizing the relative delay between the test signals and the stimulus signals by adjusting the delay circuits 715, respectively. The outputs of the LNAs 235 are cross-correlated, and output as the output signal or waveform s(t) from the dual-channel residual phase noise measurement system. The cross-correlation enables suppression of noise from the mixers and the IF stages.

Referring again to FIG. 1A, the polarity of the AM conversion gain for relative phase between the RF and LO inputs, as shown by trace 102, is negative for relative phase greater than 90 degrees and positive for relative phase less than 90 degrees. During cross-correlation using the dual-channel residual phase noise measurement system, it is desirable to have the same polarity for each of the two channels in order to avoid a phenomenon known as "cross-spectral collapse," which may occur when the AM noise partially cancels the PM noise during cross-correlation and gives a wrong phase noise measurement at frequency offsets where the AM conversion gain polarities are opposite in the two channels. During adjustment of the AM null at the output of the mixer 210 of each channel, the adjustment is done in the same direction for each channel, and the adjustment is stopped immediately after the minimum tone level of the AM modulation starts to increase again from the minimum value. This ensures that the relative phase between the RF and LO inputs for each channel are either both slighting greater than 90 degrees or slightly less than 90 degrees.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of measuring residual phase noise of a measurement signal from a device under test (DUT) using a phase detector comprising a mixer having a radio frequency (RF) input and a local oscillator (LO) input, the method comprising:

injecting a phase noise spur in a stimulus signal generated by a stimulus signal source, wherein the phase noise spur has a known magnitude at a known offset frequency from a carrier frequency of the stimulus signal;

inputting the stimulus signal with the phase noise spur to the DUT, wherein the DUT outputs a measurement signal, including the phase noise spur, in response to the stimulus signal;

inputting the measurement signal to the RF input of the mixer via an RF path;

inputting the stimulus signal to the LO input of the mixer via an LO path;

mixing the measurement signal and the stimulus signal to provide a residual phase noise signal at an output of the mixer;

measuring actual rejection of stimulus phase noise at the know offset frequency in the residual phase noise signal;

determining a relative delay between the measurement signal and the stimulus signal in the RF and LO paths based on the actual rejection of the stimulus phase noise; and minimizing the relative delay between the measurement signal and the stimulus signal in order to reduce a residual phase noise measurement floor of the phase detector.

2. The method of claim 1, wherein determining the relative delay between the measurement signal and the stimulus signal comprises:

determining a quadrature delay multiplier from the actual rejection of the stimulus phase noise, the known offset frequency, and the carrier frequency of the stimulus signal; and determining the relative delay from the quadrature delay multiplier and the carrier frequency of the stimulus signal.

3. The method of claim 2, wherein a value of the quadrature delay multiplier (n) is determined from Equation (1):

$$AR = 20 * \log_{10}\left[4\sin^2\left(\left[n\frac{\pi}{2}\right]\frac{\omega_m}{2\omega_c}\right)\right], \quad \text{Equation (1)}$$

wherein AR is the actual rejection of the stimulus phase noise, $\omega_m$ is the known offset frequency, $\omega_c$ is the carrier frequency, and n is an odd integer.

4. The method of claim 3, wherein the relative delay ($\tau$) is determined from Equation (2):

$$\tau = n\frac{\pi}{2\omega_c}. \quad \text{Equation (2)}$$

5. The method of claim 1, wherein minimizing the relative delay between the measurement signal and the stimulus signal comprises:

adjusting a cable length of at least one of the RF path or the LO path to reduce the relative delay.

6. The method of claim 1, wherein the actual rejection of the stimulus phase noise indicates stimulus phase noise suppression.

7. A method of measuring residual phase noise of a measurement signal from a device under test (DUT) using a phase detector comprising a mixer having a radio frequency (RF) input and a local oscillator (LO) input, the method comprising:

inputting a calibration stimulus signal generated by a stimulus signal source to the DUT, wherein the DUT outputs a calibration measurement signal in response to the calibration stimulus signal;

inputting the calibration measurement signal to an RF input of the mixer via an RF path;

inputting the calibration stimulus signal to an LO input of the mixer via an LO path;

mixing the calibration measurement signal and the calibration stimulus signal to provide a calibration residual phase noise signal at an output of the mixer;

monitoring a DC voltage in the calibration residual phase noise signal;

establishing an initial quadrature phase at the mixer based on the monitored DC voltage;

turning on one-tone AM modulation in the calibration stimulus signal at the stimulus signal source;

monitoring a tone frequency of a tone of the one-tone AM modulation in the calibration residual phase noise signal;

adjusting the initial quadrature phase at the mixer to obtain a measurement quadrature phase by minimizing a tone level of the tone while monitoring of the tone frequency of the tone;

inputting a stimulus signal generated by the stimulus signal source, without the one-tone AM modulation, to the DUT, wherein the DUT outputs a measurement signal in response to the stimulus signal; and mixing the measurement signal and the stimulus signal using the measurement quadrature phase to provide a residual phase noise signal at the output of the mixer, thereby significantly reducing AM noise in the residual phase noise signal.

8. The method of claim 7, wherein adjusting the initial quadrature phase at the mixer comprises:

minimizing a relative delay between the calibration measurement signal and the calibration stimulus signal.

9. The method of claim 8, wherein minimizing the relative delay between the calibration measurement signal and the calibration stimulus signal comprises adjusting one of a line stretcher or a phase shifter in one of the RF path or the LO path.

10. The method of claim 7, wherein adjusting the initial quadrature phase at the mixer comprises:

providing a phase locked loop (PLL) for maintaining a 90 degree quadrature between the calibration measurement signal and the calibration stimulus signal;

providing a digital-to-analog converter (DAC) for outputting a DC voltage to the output of the mixer; and adjusting the DC voltage output by the DAC to minimize a voltage level of the tone frequency of the tone being monitored, wherein the adjusted DC voltage changes an operating point of the PLL to a new adjusted phase shift to provide the measurement quadrature phase at the mixer.

11. The method of claim 10, wherein the DC voltage output by the DAC is adjusted using a closed loop control based on the voltage level of the tone frequency of the tone being monitored.

12. A system for measuring residual phase noise of a measurement signal from a device under test (DUT), the system comprising:

a stimulus source configured to generate a stimulus signal and a phase noise spur injected in the stimulus signal, wherein the phase noise spur has a known magnitude at a known offset frequency from a carrier frequency of the stimulus signal, wherein the stimulus signal with the phase noise spur is input to the DUT, which outputs a measurement signal in response;

a delay circuit configured to delay the stimulus signal by a variable delay amount;

a phase detector comprising a mixer configured to mix the measurement signal received from the DUT through a radio frequency (RF) path at an RF port and the delayed stimulus signal received from the delay circuit through a local oscillator (LO) path at an LO port to output a residual phase noise signal at an intermediate frequency (IF) port;

a test instrument configured to measure actual rejection of stimulus phase noise at the know offset frequency in the residual phase noise signal; and a computer processor configured to determine a relative delay between the measurement signal and the stimulus signal in the RF and LO paths based on the actual rejection of the stimulus phase noise,
wherein the relative delay is minimized between the measurement signal and the stimulus signal in order to reduce a residual phase noise measurement floor of the phase detector.

13. The system of claim 12, wherein the stimulus source comprises an arbitrary waveform generator (AWG) or a direct digital synthesizer (DDS).

14. The system of claim 12, wherein the stimulus source generates the phase noise spur using single tone phase modulation of a carrier to create a double sideband (DSB) modulated signal.

15. The system of claim 12, wherein the delay circuit comprises a voltage controlled delay line or an electronically controlled delay line.

16. The system of claim 12, wherein the measurement signal received at the RF port of the mixer is 90 degrees out of phase with the delayed stimulus signal received at the LO port of the mixer.

17. The system of claim 12, wherein determining the relative delay between the measurement signal and the stimulus signal comprises:
determining a quadrature delay multiplier from the actual rejection of the stimulus phase noise, the known offset frequency, and the carrier frequency of the stimulus signal; and
determining the relative delay from the quadrature delay multiplier and the carrier frequency of the stimulus signal.

18. The system of claim 17, wherein a value of the quadrature delay multiplier (n) is determined from Equation (1):

$$AR = 20 * \log_{10}\left[4\sin^2\left(\left[n\frac{\pi}{2}\right]\frac{\omega_m}{2\omega_c}\right)\right], \quad \text{Equation (1)}$$

wherein AR is the actual rejection of the stimulus phase noise, $\omega_m$ is the known offset frequency, $\omega_c$ is the carrier frequency, and n is an odd integer.

19. The system of claim 18, wherein the relative delay ($\tau$) is determined from Equation (2):

$$\tau = n\frac{\pi}{2\omega_c}. \quad \text{Equation (2)}$$

20. The system of claim 12, wherein the relative delay between the measurement signal and the stimulus signal is minimized by adjusting a cable length of at least one of the RF path or the LO path to reduce the relative delay.

* * * * *